United States Patent
Van De Graaff et al.

(10) Patent No.: US 9,335,372 B2
(45) Date of Patent: May 10, 2016

(54) APPARATUS AND METHODS FOR DELAY LINE TESTING

(71) Applicant: MICRON TECHNOLOGY, INC., Boise, ID (US)

(72) Inventors: Scott Van De Graaff, Boise, ID (US); Tyler Gomm, Boise, ID (US); Brandon Roth, Boise, ID (US); Eric Becker, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 137 days.

(21) Appl. No.: 13/924,231

(22) Filed: Jun. 21, 2013

(65) Prior Publication Data

US 2014/0375329 A1    Dec. 25, 2014

(51) Int. Cl.
    *G01R 31/317*    (2006.01)
(52) U.S. Cl.
    CPC .... *G01R 31/31725* (2013.01); *G01R 31/31703* (2013.01)
(58) Field of Classification Search
    CPC ..................................................... G01R 31/282
    USPC .................................. 324/511; 713/300, 500
    See application file for complete search history.

(56) References Cited

U.S. PATENT DOCUMENTS

| 5,126,691 | A | 6/1992 | Mijuskovic et al. |
| 7,039,147 | B2 * | 5/2006 | Donnelly et al. ............. 375/373 |
| 7,739,535 | B2 * | 6/2010 | Ha et al. ......................... 713/500 |
| 2007/0097778 | A1 | 5/2007 | LaBerge |

* cited by examiner

*Primary Examiner* — Arleen M Vazquez
*Assistant Examiner* — Brent J Andrews
(74) *Attorney, Agent, or Firm* — Dorsey & Whitney LLP

(57) ABSTRACT

This disclosure relates to delay line test circuits and methods. In one aspect, an integrated circuit (IC) can include a plurality of delay lines, a selection circuit, a delay comparison circuit, and a control circuit. The plurality of delay lines can generate a plurality of delayed clock signals, and the selection circuit can include a plurality of inputs configured to receive at least the plurality of delayed clock signals. The selection circuit can generate a first output clock signal and a second output clock signal by selecting amongst signals received at the plurality of inputs based on a state of a selection control signal. The delay comparison circuit can compare a delay of the first output clock signal to a delay of the second output clock signal and can generate a delay comparison such as a pass/fail flag based on the result. The control circuit can generate the selection control signal.

26 Claims, 6 Drawing Sheets

APPARATUS AND METHODS FOR DELAY LINE TESTING

BACKGROUND

1. Technical Field

Embodiments of the invention generally relate to electronics, and, in particular, to electronic testing, such as electronic verification.

2. Description of the Related Technology

An integrated circuit (IC) can be tested after manufacturing to determine whether or not the IC operates within certain performance specifications. For example, the functional operation of the IC can be tested using automatic test equipment (ATE) that applies test patterns such as vectors to the IC to evaluate the functional operation of the IC. Electronic testing can help identify ICs with manufacturing defects and/or aid in failure analysis of a particular IC design and/or layout.

There is a need for improved electronic testing.

BRIEF DESCRIPTION OF THE DRAWINGS

These drawings and the associated description herein are provided to illustrate specific embodiments of the invention and are not intended to be limiting.

To avoid repetition of description, components having the same or similar function may be referenced by the same reference number.

DETAILED DESCRIPTION OF CERTAIN EMBODIMENTS

Although particular embodiments are described herein, other embodiments, including embodiments that do not provide all of the benefits and features set forth herein, will be apparent to those of ordinary skill in the art.

Figure 1A:
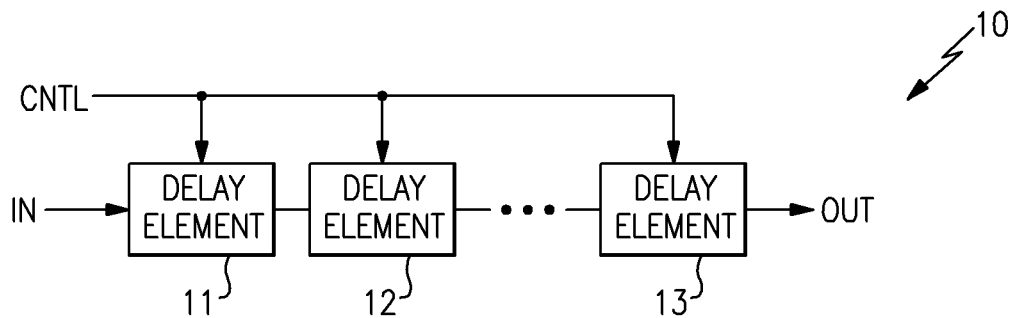
FIG. 1A is a schematic block diagram of one example of a delay line.

FIG. 1A is a schematic block diagram of one example of a delay line 10. The delay line 10 includes a first delay circuit (e.g., first delay element 11), a second delay circuit (e.g., second delay element 12), and a third delay circuit (e.g., third delay element 13). Although the delay line 10 is illustrated as including three delay elements, the delay line 10 can be adapted to include more or fewer delay elements, a different arrangement of delay elements, and/or additional circuitry.

The first delay element 11 includes an input configured to receive an input signal IN and an output electrically connected to an input of the second delay element 12. The third delay element 13 includes an input electrically connected to an output of the second delay element 12 and an output configured to generate an output signal OUT. The first to third delay elements 11-13 each further include a control input configured to receive a control signal CNTL.

The control signal CNTL can be used to control a delay of the delay elements 11-13. For example, the control signal CNTL can be used to control a transistor drive strength (e.g., control a transistor width) of the first to third delay elements 11-13 and/or to control a load such as a variable capacitance, thereby controlling the delay of the delay line 10. In certain implementations, the control signal CNTL is a digital control signal. Although one example of a delay line 10 has been illustrated, other configurations are possible, including, for example, implementations using selection circuitry such as multiplexers to control a number of delay elements that are active in a signal path between the input and output of the delay line.

The delay elements 11-13 can be implemented using, for example, digital circuits, for instance, logic gates, such as inverters, NAND gates, and/or NOR gates. However, other configurations are possible.

The delay line 10 of FIG. 1A illustrates one example of a delay line that can be tested in accordance with the teachings herein. However, other configurations of delay lines can be used.

Figure 1B:
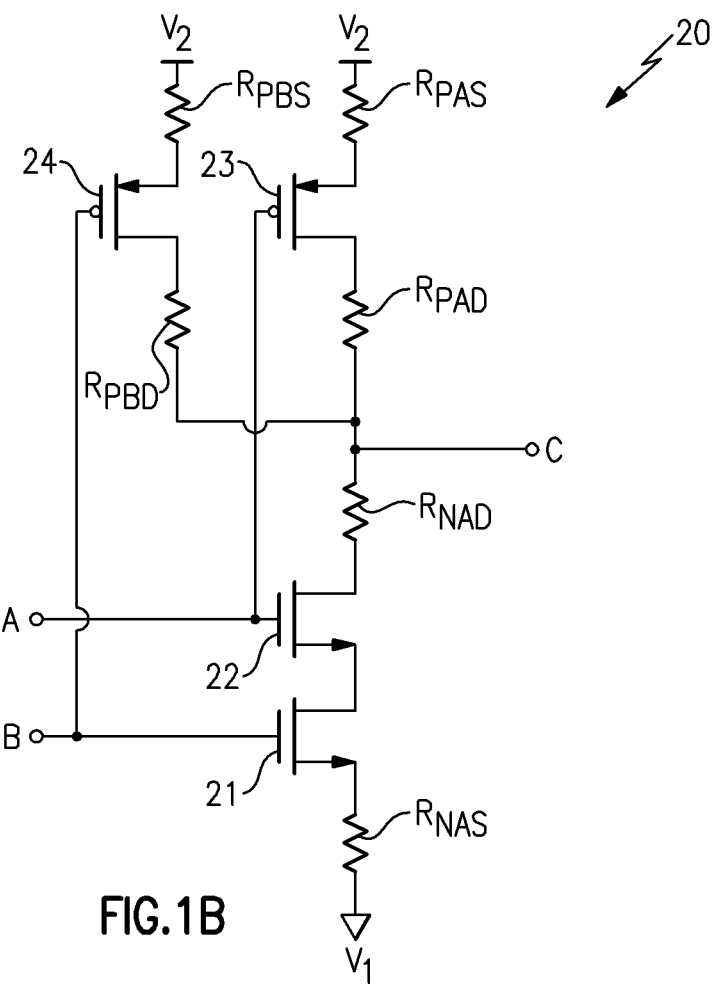
FIG. 1B is a circuit diagram of one example of a delay line logic circuit.

FIG. 1B is a circuit diagram of one example of a delay line logic circuit 20. The delay line logic circuit 20 includes a first input terminal A, a second input terminal B, an output terminal C, a first n-type metal oxide semiconductor (NMOS) transistor 21, a second NMOS transistor 22, a first p-type metal oxide semiconductor (PMOS) transistor 23, a second PMOS transistor 24, an NMOS source resistor $R_{NAS}$, an NMOS drain resistor $R_{NAD}$, a first PMOS drain resistor $R_{PAD}$, a second PMOS drain resistor $R_{PBD}$, a first PMOS source resistor $R_{PAS}$, and a second PMOS source resistor $R_{PBS}$. As used herein and as persons having ordinary skill in the art will appreciate, MOS transistors can have gates made out of metals and also materials that are not metals, such as polysilicon, and can have dielectric regions implemented not just with silicon oxide, but with other dielectrics, such as high-k dielectrics.

The illustrated delay line logic circuit 20 is implemented in a two-input NAND (NAND2) configuration. As shown in FIG. 1B, the first NMOS transistor 21 includes a source electrically connected to a first power supply $V_1$ through the NMOS source resistor $R_{NAS}$, a gate electrically connected to the second input terminal B, and a drain electrically connected to a source of the second NMOS transistor 22. The second NMOS transistor 22 further includes a gate electrically connected to the first input terminal A and a drain electrically connected to the output terminal C through the NMOS drain resistor $R_{NAD}$. Additionally, the first PMOS transistor 23 includes a source electrically connected to a second power supply $V_2$ through the first PMOS source resistor $R_{PAS}$, a gate electrically connected to the first input terminal A, and a drain electrically connected to the output terminal C through the first PMOS drain resistor $R_{PAD}$. Furthermore, the second PMOS transistor 24 includes a source electrically connected to the second power supply $V_2$ through the second PMOS source resistor $R_{PBS}$, a gate electrically connected to the second input terminal B, and a drain electrically connected to the output terminal C through the second PMOS drain resistor $R_{PBD}$.

The delay line logic circuit 20 illustrates one example of a circuit that can be included in a delay line, such as in the delay line 10 of FIG. 1A. For example, one or more instantiations of the delay line logic circuit 20 can be included as components within the delay elements of a delay line. However, other configurations of delay line logic circuits can be used in accordance with the teachings herein.

Certain electronic tests can be used to determine whether or not a delay line is functionally operational. For example, an electronic test can be used to determine whether or not a digital "1" or "0" can propagate through the delay line. A delay line may not be functionally operational for a variety of reasons, such as manufacturing defects that result in an open circuit in the signal path between the delay line's input and output.

Although it can be useful to test the functional operation of a delay line, certain types of defects can result in the delay line being functionally operational but having a delay that is outside a range of delays associated with acceptable manufacturing variation.

For example, the delay line logic circuit 20 of FIG. 1B includes certain resistors, which can be associated with the resistance of contacts used to electrically connect drain or source diffusion regions to interconnect layers such as metals. For example, in certain implementations, the NMOS drain resistor $R_{NAD}$ and the first and second PMOS drain resistors $R_{PAD}$, $R_{PBD}$ can be associated with the resistance of contacts used to contact transistor drain diffusion regions, while the NMOS source resistor $R_{NAS}$ and the first and second PMOS source resistors $R_{PAS}$, $R_{PBS}$ can be associated with the resistance of contacts used to contact transistor source diffusion regions.

In certain implementations, one or more contacts can have a defect that results in the contact having a relatively high resistance. Although the delay line may still functionally operate with the defective contact, the delay line may have a delay that is too large relative to an acceptable delay variation associated with other delay lines manufactured on the IC, which may cause reliability problems in the field. Hence, it can be desirable to catch defects associated with these delay lines during manufacturing test, including both defects that cause a delay line to be non-operational and defects that cause a delay line to operate outside of an acceptable delay range.

Provided herein are apparatus and method for electronic testing. In certain configurations, a delay line test circuit for testing a plurality of delay lines is provided. The delay line test circuit can include a control circuit, a selection circuit, and a delay comparison circuit. The selection circuit can be used to select a pair of delay lines from the plurality of delay lines, and the delay comparison circuit can be used to compare a delay of a first delay line of the selected pair to a delay of a second delay line of the selected pair to determine whether or not the a difference in delays between the first and second delay lines is within an acceptable tolerance. The control circuit can be used to provide control functionality, such as to control the selection of the delay lines and/or to control the delay setting of the delay lines. In certain configurations, the delay line test circuit is used to test one or more pairs of delay lines for multiple delay settings of the delay lines. Additionally, in certain configurations the delay line test circuit can control the timing of clock signals provided to the delay lines and/or to test selected delay lines for rising clock signal edges, for falling clock signal edges, or for both rising and falling clock signal edges.

The delay line test circuits provided herein can be used to verify the delay of all or part of the delay elements in a cascade (e.g., string) of delay elements associated with a delay line. Configuring the delay line test circuit in this manner can aid in localizing a failure of a delay line. In certain implementations, the testing circuitry can be used to test delay lines while having a relatively small impact on overall test time and cost. For example, in certain configurations, the delay line test can be included in a testing sequence associated with cold and/or hot burn testing. Additionally, in certain implementations, the delay line testing circuitry can be incorporated in an IC test module providing other testing functionality, thereby reducing the impact on the IC's circuit area and/or routing.

Figure 2:
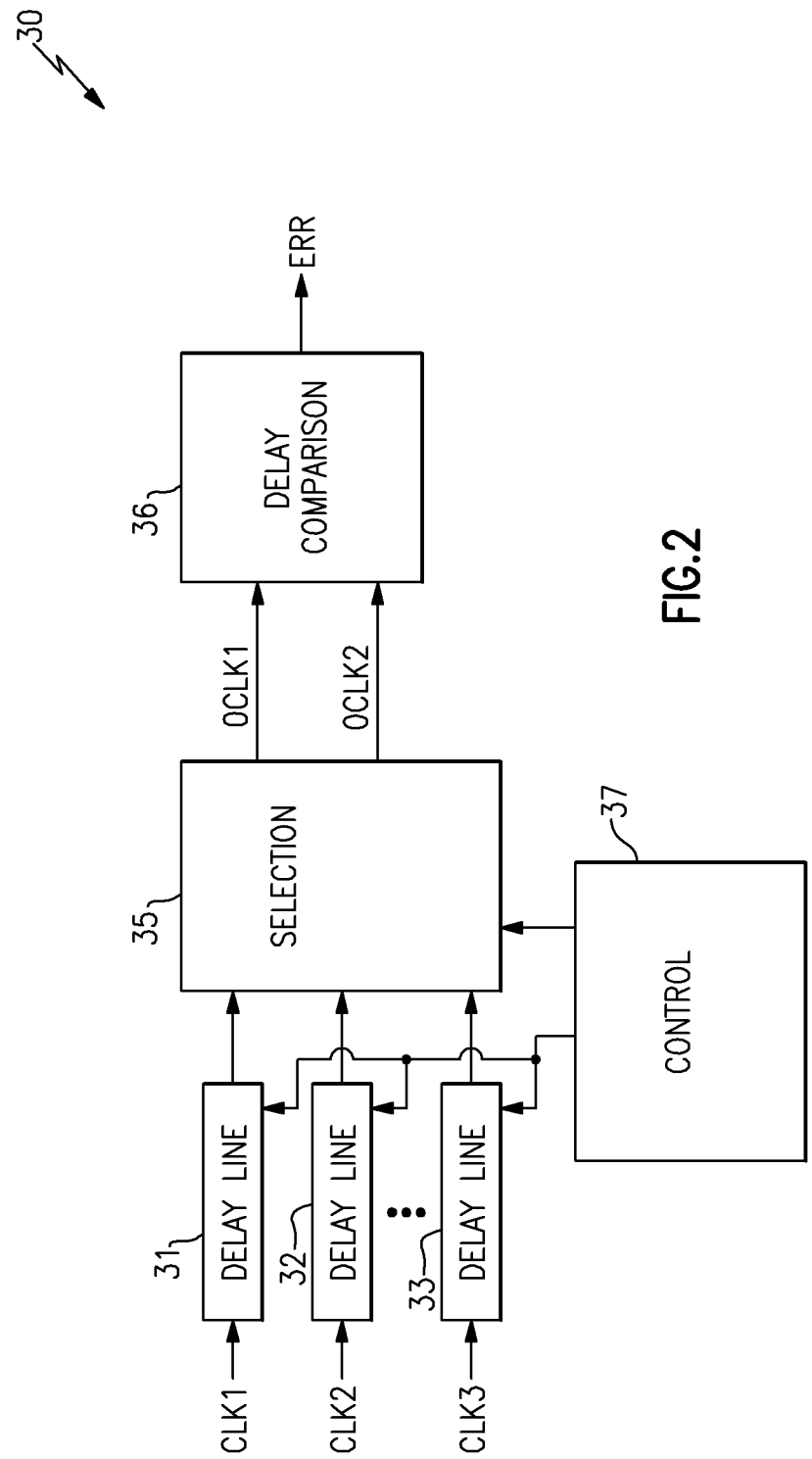
FIG. 2 is a schematic block diagram of one embodiment of a delay line test circuit.

FIG. 2 is a schematic block diagram of one embodiment of a delay line test circuit 30. The delay line test circuit 30 includes a selection circuit 35, a delay comparison circuit 36, and a control circuit 37, and can be used to test a first delay line 31, a second delay line 32, and a third delay line 33. Although FIG. 2 illustrates a configuration in which the delay line test circuit 30 is used to test three delay lines, the delay line test circuit 30 can be adapted to test more or fewer delay lines.

The first delay line 31 includes an input configured to receive a first clock signal CLK1 and an output electrically connected to a first input of the selection circuit 35. The second delay line 32 includes an input configured to receive a second clock signal CLK2 and an output electrically connected to a second input of the selection circuit 35. The third delay line 33 includes an input configured to receive a third clock signal CLK3 and an output electrically connected to a third input of the selection circuit 35. The first, second, and third delay lines 31-33 each further include a control input configured to receive a delay control signal from the control circuit 37. As illustrated, the first, second, and third delay lines 31-33 are arranged in parallel, rather than arranged in series.

The selection circuit 35 further includes a first output configured to generate a first output clock signal OCLK1, a second output configured to generate a second output clock signal OCLK2, and a control input configured to receive a selection control signal from the control circuit 37. The delay comparison circuit 36 includes a first input configured to receive the first output clock signal OCLK1, a second input configured to receive the second output clock signal OCLK2, and an output configured to generate an error signal ERR.

The first to third delay lines 31-33 can be implemented using any suitable delay line configuration. In one embodiment, the first to third delay lines 31-33 are implemented using the configuration shown in FIG. 1A. However, other configurations are possible.

Although certain electrical connections between the delay line test circuit 30 and the first to third delay lines 31-33 have been illustrated in FIG. 2, the first to third delay lines 31-33 are typically connected to other components and circuitry associated with normal operation of the delay lines in the IC. For example, in certain configurations, the delay lines 31-33 are implemented as a part of one or more delay locked loops (DLLs). These DLLs can provide timing for the outputting of data from a memory device. These details have been omitted for purposes of figure clarity. In one embodiment, the first to third clock signals CLK1-CLK3 are associated with disparate clock signals of a memory device. Not all types of memory chips utilize clock signals. In one embodiment, a memory device comprises a synchronous memory of volatile memory cells, such as, but not limited to, synchronous dynamic random access memories known as SDRAM, DDR, DDR2, and DDR3. The principles and advantages disclosed herein can also be applied to memories comprising non-volatile memory cells, such as flash memory. Although one example of an implementation in which the delay lines can be used has been provided, the delay lines can be used in other configurations.

The selection circuit 35 can use the selection control signal from the control circuit 37 to control the electrical connections between the selection circuit's outputs and inputs. In one example, when the selection control signal indicates that the first output clock signal OCLK1 should correspond to the third clock signal CLK3 and that the second output clock signal OCLK2 should correspond to the first clock signal CLK1, the selection circuit 35 can electrically connect the selection circuit's third input to the first output and electrically connect the selection circuit's first input to the second output. In another example, when the selection control signal indicates that the first output clock signal OCLK1 should correspond to the second clock signal CLK2 and that the second output clock signal OCLK2 should correspond to the third clock signal CLK3, the selection circuit 35 can electrically connect the selection circuit's second input to the first output and electrically connect the selection circuit's third input to the second output. Accordingly, the control circuit 37 can use the selection control signal to select a pair of delay lines from the first to third delay lines 31-33 and to provide clock signals associated with the selected pair to the delay comparison circuit 36.

The delay comparison circuit 36 can be used to compare a delay associated with the first output clock signal OCLK1 to a delay associated with the second output clock signal OCLK2 and to control a state of the error signal ERR based on the result. For example, in certain implementations, the delay line test circuit 30 can be configured to enable the error signal ERR when a difference in delays between the first and second output clock signals OCLK1, OCLK2 exceeds a delay threshold, and to otherwise disable the error signal ERR. In one embodiment, the delay threshold is digitally configurable. In another embodiment, the delay threshold is predetermined.

As shown in FIG. 2, the control circuit 37 can be used to provide a delay control signal to the first to third delay lines 31-33 for a test mode of operation. During normal operation, the first to third delay lines 31-33 can be controlled by other circuits within a delay-locked loop of a synchronous memory. These other circuits can control the first to third delay lines 31-33 via the control circuit 37 or independent of the control circuit 37 depending on circuit configuration. The delay control signal can be used to control a delay setting of the first to third delay lines 31-33. In one embodiment, the delay control signal is a digital delay control signal used to select at least one of a delay line load capacitance, a transistor drive strength, or a number of active delay elements.

In certain configurations, the control circuit 37 is configured to test the delay lines at multiple delay settings, such as at every delay setting. Configuring the delay line test circuit 30 in this manner can aid in determining whether or not there is a defect associated with a particular delay setting.

The delay line test circuit 30 can be fabricated on a common IC with the delay lines 31-33. Fabricating the delay line test circuit 30 on the same IC as the delay lines 31-33 can reduce testing time and/or expense relative to a configuration in which the delays of the delay lines 31-33 are measured or compared using external measurement equipment, which can be expensive. Accordingly, the teachings herein can be used to provide on-chip testing of delay lines, such as during an IC's built-in self-test (BIST). Comparing the delays of the delay lines 31-33 on-chip can also provide enhanced accuracy relative to a configuration in which delays are measured externally.

Figure 3:
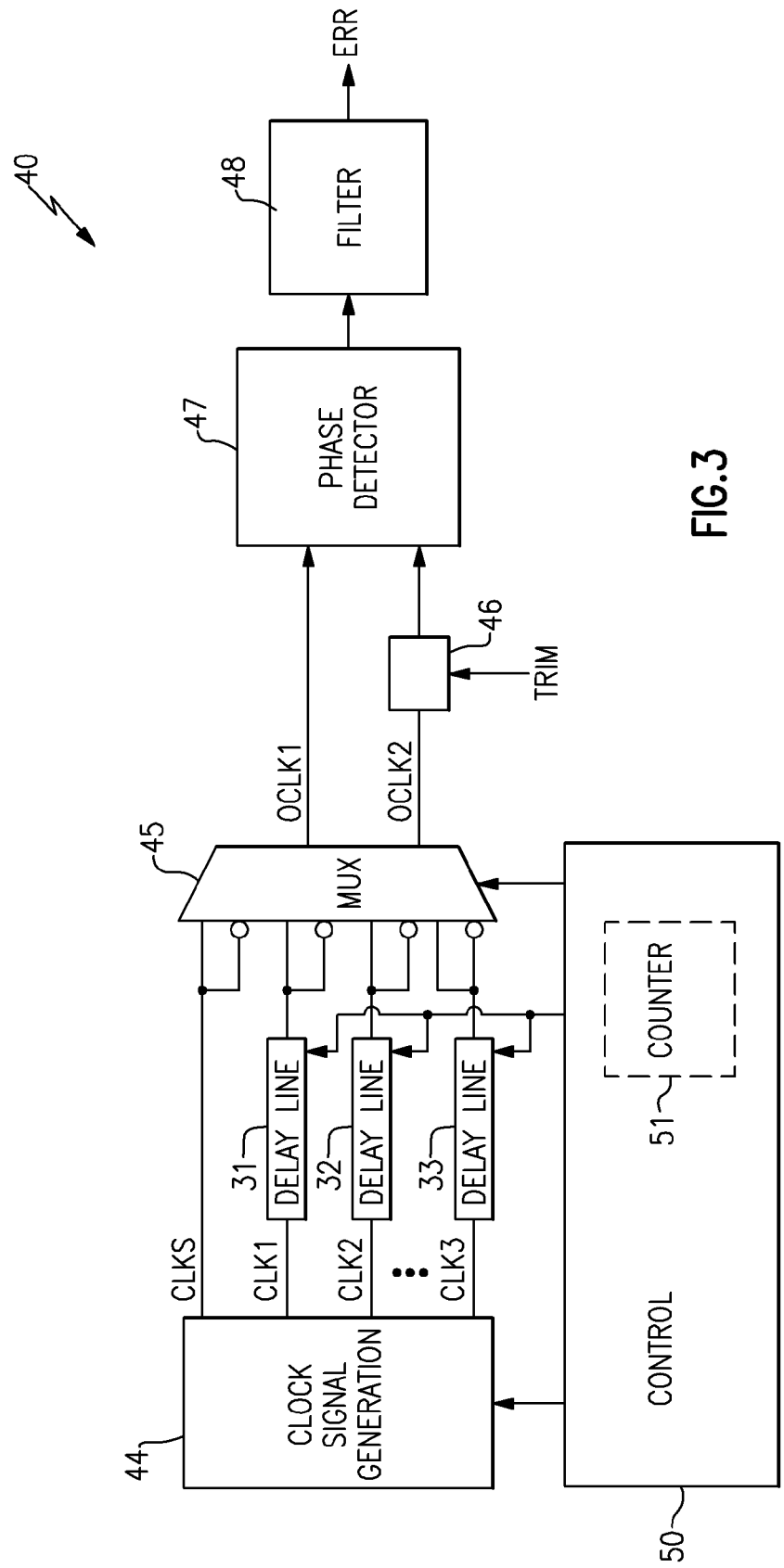
FIG. 3 is a schematic block diagram of another embodiment of a delay line test circuit.

FIG. 3 is a schematic block diagram another embodiment of a delay line test circuit 40. The delay line test circuit 40 includes a clock signal generation circuit 44, a multiplexer 45, a trim circuit 46, a phase detector 47, a filter 48, and a control circuit 50, and can be used to test the first delay line 31, the second delay line 32, and the third delay line 33. Although FIG. 3 illustrates a configuration in which the delay line test circuit 40 is used to test three delay lines, the delay line test circuit 40 can be adapted to test more or fewer delay lines.

The clock signal generation circuit 44 includes a control input configured to receive a clock generation control signal from the control circuit 50, a first output configured to generate a test clock signal CLKS, a second output configured to generate a first clock signal CLK1, a third output configured to generate a second clock signal CLK2, and a fourth output configured to generate a third clock signal CLK3.

The first delay line 31 includes an input configured to receive the first clock signal CLK1, the second delay line 32 includes an input configured to receive the second clock signal CLK2, and the third delay line 33 includes an input configured to receive the third clock signal CLK3. The first to third delay lines 31-33 each further include a control input configured to receive a delay control signal from the control circuit 50.

The multiplexer 45 includes a first non-inverting input configured to receive the clock signal CLKS, a first inverting input configured to receive the clock signal CLKS, a second non-inverting input electrically connected to an output of the first delay line 31, a second inverting input electrically connected to the output of the first delay line 31, a third non-inverting input electrically connected to an output of the second delay line 32, a third inverting input electrically connected to the output of the second delay line 32, a fourth non-inverting input electrically connected to an output of the third delay line 33, a fourth inverting input electrically connected to the output of the third delay line 33, and a control input configured to receive a selection control signal from the control circuit 50. The multiplexer 45 further includes a first output configured to generate a first output clock signal OCLK1 and a second output configured to generate a second output clock signal OCLK2.

The trim circuit 46 includes an input configured to receive the second output clock signal OCLK2. The trim circuit 46 further includes a control input configured to receive a trim control signal TRIM. The phase detector 47 includes a first input configured to receive first output clock signal OCLK1 and a second input electrically connected to an output of the trim circuit 46. The phase detector 47 further includes an output electrically connected an input of the filter 48 and configured to generate a comparison signal. The filter 48 further includes an output configured to generate an error signal ERR.

The first to third delay lines 31-33 can delay the first to third clock signals CLK1-CLK3 based on a delay amount indicated by the delay control signal. In certain configurations, the delay control signal can be a digital delay control signal used to control at least one of transistor strength, capacitive load, or a number of active delay elements of the delay lines 31-33. However, other configurations are possible, such as analog delay line configurations and/or digital delay line configurations implemented using other delay control schemes. Although FIG. 3 illustrates the control circuit 50 as providing a common delay control signal to the first to third delay lines 31-33, the teachings herein are applicable to configurations in which the control circuit 50 provides separate control signals to the delay lines 31-33.

In certain configurations, the control circuit 50 can be used to test the delay lines 31-33 at multiple delay settings. In one embodiment, the control circuit 50 tests every combination of delay settings. Configuring the delay line test circuit 40 to test multiple delay settings can aid in detecting errors associated with a particular delay setting. For example, in an implementation in which the delay control signal is used to switch transistors into or out of the delay line to control drive strength, testing a particular delay configuration can aid in detecting manufacturing defects in transistor contacts associated with transistors enabled in a particular delay setting. Additionally, in an implementation in which delay control signal is used to select a number of delay elements in the delay line, testing a particular delay configuration can aid in detecting a defect associated with a particular delay element.

In the illustrated configuration, the multiplexer 45 can use the selection control signal from the control circuit 50 to determine which signals received at the multiplexer's inputs are used to generate the first and second output clock signals OCLK1, OCLK2. The multiplexer 45 can be used to select the same or different signals for the first and second output clock signals OCLK1, OCLK2. In the illustrated configuration, certain inputs of the multiplexer 45 are indicated as non-inverting inputs and certain inputs of the multiplexer 45 are indicated as inverting inputs. In certain implementations, the logical inversion associated with an inverting input relative to a non-inverted input is provided using a digital inverter.

The phase detector 47 can be used to detect a phase difference between an edge of the first output clock signal OCLK1 and a correspond edge of the second output clock signal OCLK2. In certain configurations, the phase detector 47 determines whether or not a delay between a rising or falling edge of the first output clock signal OCLK1 and a corresponding edge of the second output clock signal OCLK2 is greater than a delay threshold. However, the phase detector 47 need not be operable to compare both rising and falling edges of the output clock signals OCLK1, OCLK2. For example, in one embodiment, a phase detector can be configured to compare only rising edges of the output clock signals. In such a configuration, a selection circuit such as a multiplexer can be used to selectively invert the output clock signals such that the phase detector receives rising edges. In one embodiment, the trim circuit 46 is used to tune a value of the delay threshold by controlling an amount of hysteresis of the phase detector 47. In certain configurations, the trim control signal is a digital signal. In one embodiment, the delay threshold can be tuned to a threshold value be between about 50 picoseconds (ps) and about 150 ps. However, other configurations are possible.

The filter 48 can be used to filter the output of the phase detector 47 to generate the error signal ERR. For example, the filter 48 can be a low pass filter configured to remove high frequency glitches from the output of the phase detector 47. In one embodiment, the filter 48 is implemented as a majority filter configured to count a number of occurrences of different states of the error signal ERR over a number of clock signal periods and to generate an output corresponding to the state with the greatest number of occurrences.

The clock signal generation circuit 44 can be used to generate the test clock signal CLKS and the first to third clock signals CLK1-CLK3. In certain configurations, the clock signal generation circuit 44 generates the first to third clock signals CLK1-CLK3 by passing a common system clock signal such that the first to third clock signals CLK1-CLK3 have substantially the same frequency and phase. In the configuration shown in FIG. 3, the clock signal generation circuit 44 receives a clock generation control signal from the control circuit 50. The clock generation control signal can be used to, for example, control the timing of the clock signals provided to the delay lines 31-33 and/or the multiplexer 45. For example, in certain implementations, the clock signal generation circuit 44 can be used to generate the first to third clock signals CLK1-CLK3 to have about the same frequency and about the same phase such that a phase difference detected by the phase detector 47 can correspond to a delay associated with manufacturing variation of the delay lines.

Furthermore, in certain implementations, the clock generation control signal is used to control whether a rising or falling edge of the clock signals is tested by the delay line test circuit 40. In one embodiment, the delay line test circuit 40 is configured to test the delay lines 31-33 for both rising and falling clock signal edges. Configuring the delay line test circuit 40 to test both rising and falling clock signal edges can aid in detecting errors associated with both pull-up (e.g., PMOS) and pull-down (e.g., NMOS) transistor networks of the delay lines 31-33. For example, in certain implementations, different pull-up and pull-down transistor networks activate for rising and falling clock edges, and thus testing the delay lines for different edges can enhance the detection of defects by increasing testing coverage. However, other configurations are possible, including, for example, configurations in which a delay line test circuit tests only rising or falling edges of clock signals.

The delay line test circuit 40 can be used to compare the delays of one or more selected pairs of the first to third delay lines 31-33. For example, in one embodiment, the delay line test circuit 40 can be used to test every combination of the first to third delay lines 31-33. For example, in a configuration including n delay lines, the delay line test circuit 40 can be implemented to test $$\binom{n}{2}$$

or n choose 2 combinations of delay lines. However, other configurations are possible, such as implementations in which the delay line test circuit 40 tests less than all possible combinations of delay lines.

In the illustrated configuration, the control circuit 50 includes a counter 51, which can be used to count through a sequence of states corresponding to different selection control settings of the multiplexer 45.

For example, in one embodiment, the counter 51 is a 3-bit counter configured to count through $2^3$ or 8 control states of the multiplexer 45. In one embodiment, the counter 51 is configured to count through the states shown in Table 1 below.

TABLE 1

| Counter | OCLK1 | OCLK2 |
|---------|-------|-------|
| 000 | CLKS | CLKS |
| 001 | CLK1 | CLK2 |
| 010 | CLK2 | CLK3 |
| 011 | CLK3 | CLK1 |
| 100 | ~CLK1 | ~CLK2 |
| 101 | ~CLK2 | ~CLK3 |
| 110 | ~CLK3 | ~CLK1 |
| 111 | CLKS | ~CLKS |

In the configuration shown in Table 1, the counter 51 can operate as a finite state machine that sequences through eight states. As shown in Table 1, the counter 51 can be used to control the selection of the multiplexer 45 based on the counter's state.

For example, in a first state (000), the first and second output clock signals OCLK1, OCLK2 can correspond to the test clock signal CLKS received at the multiplexer's first non-inverting input. Since the first and second output clock signals OCLK1, OCLK2 have about the same delay in this configuration, the delay line test circuit 40 should always pass in this state, absent a defect in the delay line test circuit 40. Additionally, in a second state (001), a third state (010), and a fourth state (011), the counter 51 can control the multiplexer 45 to test different combinations of delay lines associated with the multiplexer's second non-inverting input (first clock signal CLK1), third non-inverting input (second clock signal CLK2), and fourth non-inverting input (third clock signal CLK3). Furthermore, in a fifth state (100), a sixth state (101), and a seventh state (110), the counter 51 can control the multiplexer 45 to test different combinations of delay lines associated with the multiplexer's second inverted input (inverted first clock signal ~CLK1), third inverted input (inverted second clock signal ~CLK2), and fourth inverted input (inverted third clock signal ~CLK3). Additionally, in an eighth state (111), the first output clock signal OCLK1 can correspond to the multiplexer's first non-inverted input (test clock signal CLKS) and the second output clock signal OCLK2 can correspond to the multiplexer's first inverted input (inverted test clock signal ~CLKS). Since the first and second output clock signals OCLK1, OCLK2 are logically inverted in this configuration, the delay line test circuit 40 should always fail in the eighth state, absent a defect in the delay line test circuit 40.

Although Table 1 illustrates one example of a testing sequence for the delay line test circuit 40, a wide variety of testing sequences and configurations can be used.

Figure 4A:
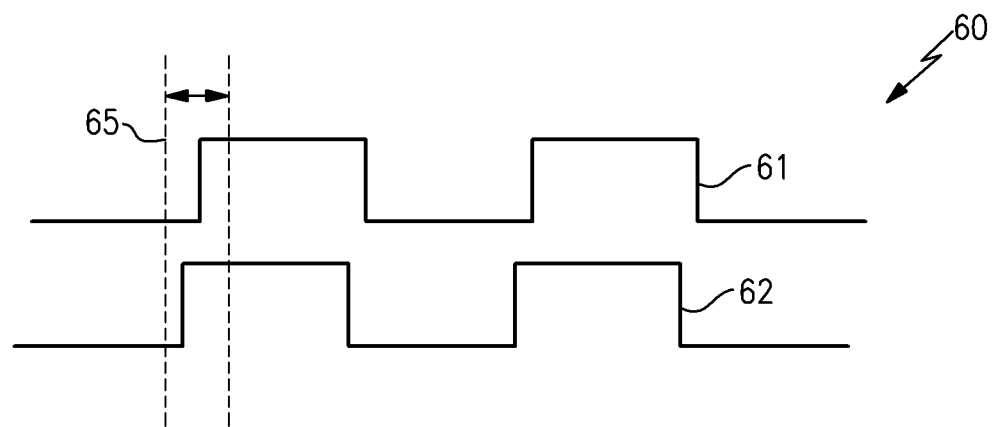
FIGS. 4A-4C are graphs of three examples of delay line clock signal waveforms.
Figure 4B:
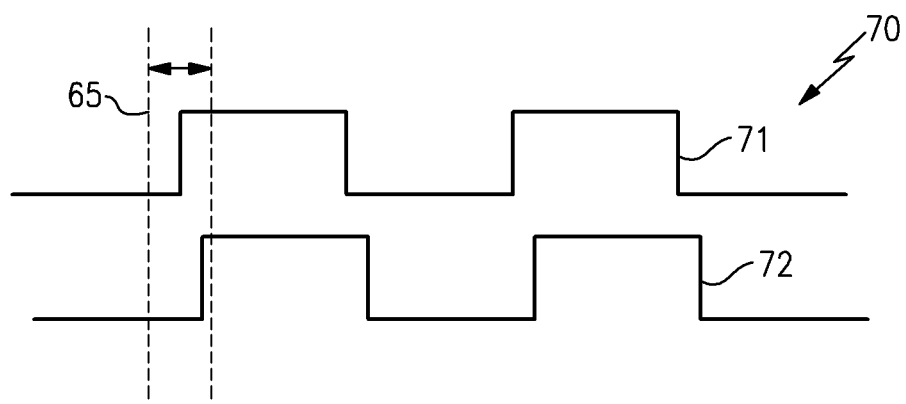
Figure 4C:
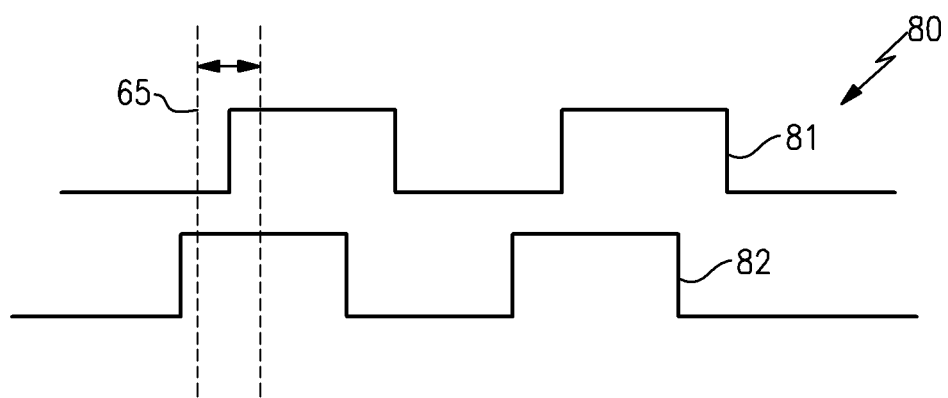

FIGS. 4A-4C are graphs of three examples of delay line clock signal waveforms.

FIG. 4A is a first graph 60 of one example of a timing diagram of a first clock signal 61 and a second clock signal 62. The first graph 60 also includes a timing window 65 corresponding to an acceptable delay variation between the first and second clock signals 61, 62. In the illustrated configuration, the timing window 65 is centered on a rising edge of the first clock signal 61. However, other configurations are possible. In certain implementations, a width of the timing window 65 can be related to a delay threshold used by a delay comparison circuit, such as the phase detector 47 of FIG. 3. Although the first clock signal 61 is delayed relative to the second clock signal 62, the delay variation can be within an accepted tolerance since the rising edges of the first and second clock signals 61, 62 both occur within the timing window 65.

FIG. 4B is a second graph 70 of another example of a timing diagram of a first clock signal 71 and a second clock signal 72. The second graph 70 has also been annotated to include the timing window 65. Although the second clock signal 72 is delayed relative to the first clock signal 71, the delay variation can be within an accepted tolerance since the rising edges of the first and second clock signals 71, 72 both occur within the timing window 65.

FIG. 4C is a third graph 80 of another example of a timing diagram of a first clock signal 81 and a second clock signal 82. The third graph 80 has also been annotated to include the timing window 65. The rising edges of the first and second clock signals 81, 82 of FIG. 4C do not both occur within the timing window 65, and thus the delay variation can be outside an accepted delay variation.

Figure 5:
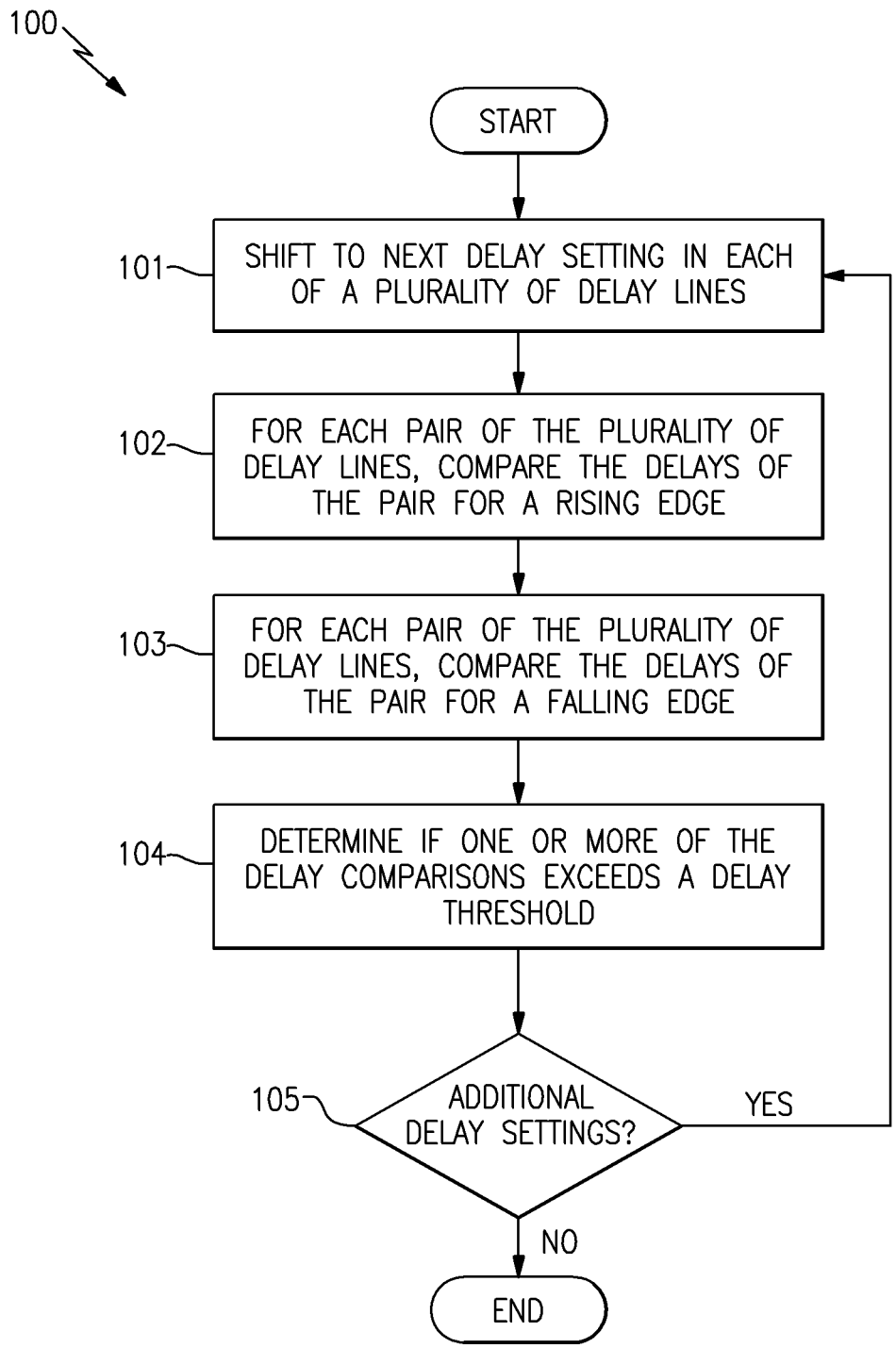
FIG. 5 is a flow diagram of an illustrative process of delay line testing according to one embodiment.

FIG. 5 is a flow diagram of an illustrative process 100 of delay line testing according to one embodiment. The process 100 can be implemented, for example, by the delay line test circuit 40 of FIG. 3. It will be understood that the process 100 can include greater or fewer operations than illustrated. Moreover, the operations of the process 100 can be performed in any order as appropriate.

At block 101, the next delay setting can be shifted to in each of a plurality of delay lines. In certain implementations, a control circuit, such as the control circuit 50 of FIG. 3 can be used to shift to or set the next delay setting for each delay line. In certain configurations, the delay lines are implemented using a plurality of delay elements, and shifting to the next delay setting includes shifting to the next delay element in the delay lines.

At block 102, for each pair of the plurality of delay lines, the delays of the pair can be compared for a rising edge. In certain configurations, the delay comparison is performed using a delay comparison circuit, such as the phase detector 47 of FIG. 3.

With continuing reference to FIG. 5, at block 103, for each pair of the plurality of delay lines, the delays of the pair can be compared for a falling edge. The delay comparison is performed using a delay comparison circuit, such as the phase detector 47 of FIG. 3.

At a block 104, whether one or more of the delay comparisons exceeds a delay threshold can be determined. In certain configurations, a delay comparison circuit is used to determine whether or not a delay comparison exceeds the delay threshold. In certain configurations, a filter is used to reduce or avoid false determinations. Determining when a delay comparison exceeds the delay threshold can aid in identifying defects that result in an unacceptable delay variation in a delay line.

Defects can be hard to observe and circuits added to detect defects can raise manufacturing costs. One advantage of disclosed techniques is that relatively little extra circuitry is used to detect defects. In one embodiment, delays through the delay lines that are implemented in delay-locked loops and relative comparisons among these delays are used for the built-in self tests. Additional delay lines solely for built-in self-test (BIST) are not needed. Defects can be expected to be relatively rare, so that if a defect occurs, most of the time, only one of the delay lines will have the defect. Even in situations in which more than one defect exists, the defects can be expected to differ in nature such that the defects can still be detected via a comparison.

At decision block 105, whether or not additional delay settings of the delays lines can be determined. When additional delay settings of the delay lines are present, the process 100 can return to block 101. When no additional delay settings are present, the process 100 can end. In certain configurations, at each delay setting of the delay lines, the blocks 102-104 can be performed for each combination of control states of a selection circuit. For example, in one embodiment, the multiplexer 45 of FIG. 3 is used for selecting delay lines for comparison, and a delay comparison is performed for each state of the multiplexer shown in Table 1 above.

Although the process 100 is illustrated as including certain operations, the process 100 can be adapted in a variety of ways. For example, the process 100 can be implemented to include additional steps, such as testing with always pass and/or always fail sequences to identify defects in the test circuitry and/or test setup. Additionally, in certain configurations, the process 100 can be implemented to test less than all combinations of delay settings, delay line pairs, and/or edges.

Figure 6:
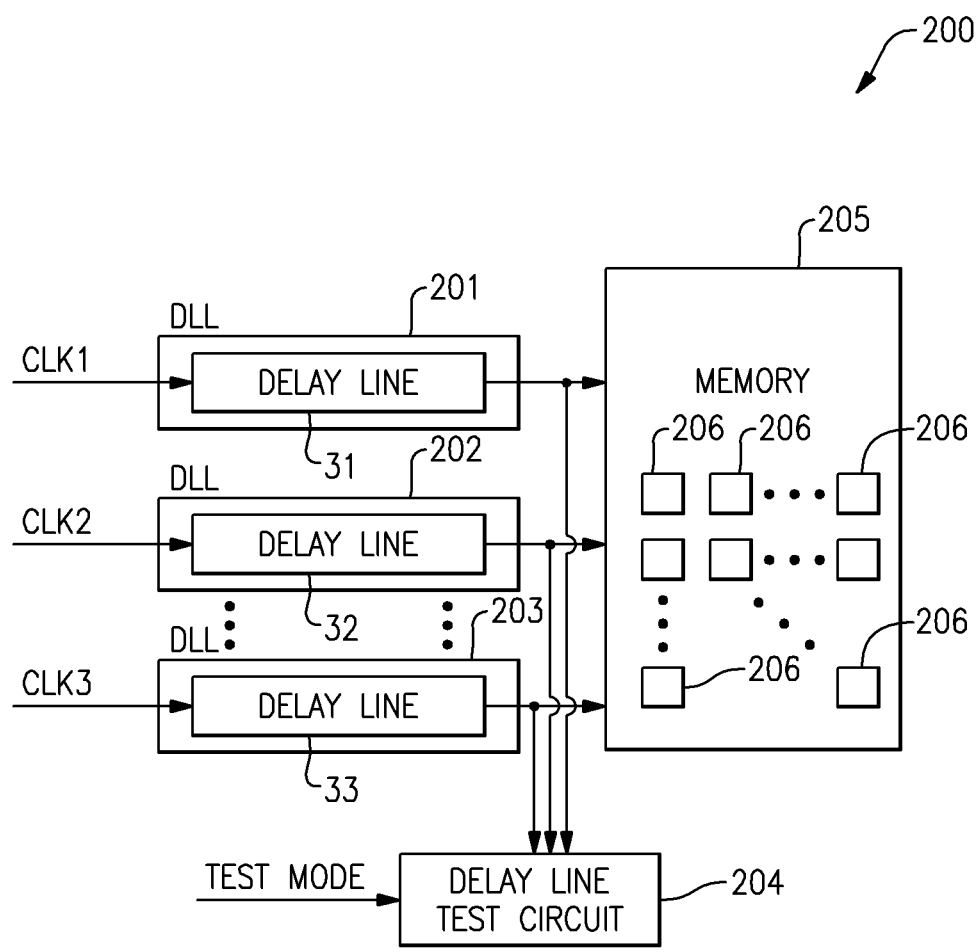
FIG. 6 is a schematic diagram of one embodiment of an integrated circuit (IC).

FIG. 6 is a schematic diagram of one embodiment of an integrated circuit (IC) 200. The integrated circuit 200 includes a first delay locked loop (DLL) 201, a second DLL 202, a third DLL 203, a delay line test circuit 204, and a memory (e.g., memory array 205). The first DLL 201 includes the delay line 31, the second DLL 202 includes the delay line 32, and the third DLL includes the delay line 33. The memory array 205 includes a plurality of memory elements 206.

Although FIG. 6 illustrates the integrated circuit 200 as including three DLLs, the integrated circuit 200 can include more or fewer DLLs. Additionally, in certain embodiments, a DLL can be used to control multiple delay lines.

As shown in FIG. 6, the first to third delay lines 31-33 are configured to receive first to third clock signals CLK1-CLK3, respectively, and to delay the clock signals to generate delayed clocks signals for the memory array 203. In certain implementations, the memory array 203 is a synchronous memory array, and the delayed clock signals can be used to control memory operations such as data output of the memory. In one embodiment, the memory array 203 is a synchronous dynamic random access memory (DRAM) array.

As shown in FIG. 6, the delay line test circuit 204 is configured to receive the delayed clock signals generated by the delay lines 31-33 and a test mode signal. During normal operation, the first to third delay lines 31-33 can be controlled by the first to third DLLs 201-203. However, during test operation, the first to third delay lines 31-33 can be controlled at least in part by the delay line test circuit 204, which can compare delays of the first to third delay lines 31-33 to one another. The delay line test circuit 204 can be implemented using, for example, the test circuit configurations shown in FIGS. 2 and 3. However, other implementations are possible.

Although FIG. 6 illustrates one embodiment of an IC in accordance with the teachings herein, other configurations are possible.

In one embodiment, an IC includes a plurality of delay lines configured to generate a plurality of delayed clock signals. Each of the plurality of delay lines includes a plurality of delay circuits, and the plurality of delay lines are arranged in parallel. The IC further includes a selection circuit including a plurality of inputs configured to receive at least the plurality of delayed clock signals, and the selection circuit is configured to generate a first output clock signal and a second output clock signal by selecting amongst signals received at the plurality of inputs of the selection circuit based on a state of a selection control signal. The IC further includes a delay comparison circuit configured to determine whether or not a defect is present based on a comparison between a delay of the first output clock signal and a delay of the second output clock signal.

In another embodiment, an electronically implemented method of built-in self-test (BIST) is provided. The method includes receiving a signal to place an integrated circuit (IC) in a test mode. The IC includes at least a first delay line, a second delay line, and a delay comparison circuit, and the first delay line and the second delay line are arranged in parallel. The method further includes comparing a delay of the first delay line to the delay of a second delay line using the delay comparison circuit for each of a plurality of selected delay settings, and determining if one or more of the delay comparisons exceeds a delay threshold using the delay comparison circuit to determine whether or not a defect exists in the IC.

In another embodiment, an IC includes a memory including a plurality of memory cells, a first delay locked loop including a first delay line, a second delay line, and a delay line test circuit. Additionally, in a first mode of operation, the first delay locked loop is configured to provide timing for outputting data from the plurality of memory cells. Additionally, in a second mode of operation, the delay line test circuit compares delays of the first delay line and the second delay line to each other to determine whether or not a defect exists.

In another embodiment, an apparatus includes three or more delay lines, a selection circuit configured to select a pair of delay lines from the three or more delay lines based on a state of a selection control signal, a delay comparison circuit, and a control circuit configured to generate the selection control signal. The delay comparison circuit can compare a delay of a first delay line of the selected pair of delay lines to a delay of a second delay line of the selected pair of delay lines and can generate a delay comparison based on the result.

In the embodiments described above, delay line test circuits can be implemented in any electronic device with a need for electronic delay line testing. As such, the electronic test circuits and test methods described herein can be incorporated in various electronic devices. Examples of the electronic devices can include, but are not limited to, consumer electronic products, electronic circuits, electronic circuit components, parts of the consumer electronic products, electronic test equipment, etc. Examples of the consumer electronic products include, but are not limited to, a mobile phone, a telephone, a television, a computer monitor, a computer, a hand-held computer, a laptop computer, a tablet computer, a personal digital assistant (PDA), a microwave, a refrigerator, a stereo system, a cassette recorder and/or player, a DVD player, a CD player, a VCR, an MP3 player, a radio, a camcorder, an optical camera, a digital camera, a washer, a dryer, a washer/dryer, a copier, a facsimile machine, a scanner, a multi-function peripheral device, a wrist watch, a clock, etc. Further, the electronic device can include unfinished products. The disclosed techniques are not applicable to mental steps, and are not performed within the human mind or by a human writing on a piece of paper.

The foregoing description and claims may refer to elements or features as being "connected" or "coupled" together. As used herein, unless expressly stated to the contrary, "connected" means that one element/feature is directly or indirectly connected to another element/feature, and not necessarily mechanically. Likewise, unless expressly stated to the contrary, "coupled" means that one element/feature is directly or indirectly coupled to another element/feature, and not necessarily mechanically. Thus, although the drawings illustrate various examples of arrangements of elements and components, additional intervening elements, devices, features, or components may be present in an actual embodiment. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Any combination of the features of the methods described herein may be embodied in code stored in a non-transitory computer readable medium. When executed, the non-transitory computer readable medium may cause some or all of any of the methods described herein to be performed. It will be understood that any of the methods discussed herein may include greater or fewer operations and that the operations may be performed in any order, as appropriate. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times. Moreover, it will be understood that the methods discussed herein are performed at least partly by physical circuitry. Accordingly, the claims are not intended to cover purely metal processes or abstract ideas.

Various embodiments have been described above. Although described with reference to these specific embodiments, the descriptions are intended to be illustrative and are not intended to be limiting. Various modifications and applications may occur to those skilled in the art.

What is claimed is:

1. An integrated circuit comprising:
a plurality of delay lines configured to generate a plurality of delayed clock signals, wherein each of the plurality of delay lines comprises a plurality of delay circuits each having an input receiving a clock signal, wherein the clock signals are time-independent relative to each other, and wherein the inputs of the plurality of delay lines are arranged in parallel;
a selection circuit including a plurality of inputs configured to receive at least the plurality of delayed clock signals, wherein the selection circuit is configured to generate a first output clock signal and a second output clock signal by selecting amongst signals received at the plurality of inputs of the selection circuit based on a state of a selection control signal; and
a delay comparison circuit configured to determine whether or not a manufacturing defect is present within one or more of the plurality of delay lines based on a comparison between a delay of the first output clock signal and a delay of the second output clock signal.

2. The integrated circuit of claim 1, further comprising a control circuit to generate the selection signal.

3. The integrated circuit of claim 2, wherein the control circuit is further configured to generate a delay control signal, wherein the delay control signal is configured to control a delay setting of the plurality of delay lines.

4. The integrated circuit of claim 3, wherein the delay control signal is configured to control at least one of a load capacitance, a transistor drive strength, or a number of active delay circuits of the plurality of delay lines.

5. The integrated circuit of claim 2, wherein the control circuit further comprises a counter, wherein the counter is configured to count through a sequence of states, wherein the selection control signal is based on a state of the counter.

6. The integrated circuit of claim 2, further comprising a clock signal generation circuit configured to generate a plurality of input clock signals to the plurality of delay lines.

7. The integrated circuit of claim 6, wherein the control circuit is further configured to generate a clock generation control signal, wherein the clock signal generation circuit is configured to control a timing of the plurality of input clock signals based on the clock generation control signal.

8. The integrated circuit of claim 1, wherein the delay comparison indicates whether a delay between the first and second output clock signals is greater than a delay threshold.

9. The integrated circuit of claim 8, wherein the delay threshold is digitally configurable.

10. The integrated circuit of claim 1, wherein the delay comparison circuit comprises a phase detector.

11. The integrated circuit of claim 10, further comprising a filter configured to filter the delay comparison to generate an error signal.

12. The integrated circuit of claim 1, wherein the selection circuit comprises a multiplexer.

13. The integrated circuit of claim 1, wherein the plurality of inputs of the selection circuit is further configured to receive a test clock signal.

14. The integrated circuit of claim 1, wherein the integrated circuit further comprises a synchronous dynamic random access memory having a delay-locked loop including one or more of the plurality of delay lines.

15. An electronically-implemented method of built-in self-test (BIST), the method comprising:
receiving a signal to place an integrated circuit (IC) in a test mode, wherein the IC comprises at least a first delay line having an input, a second delay line having an input, and a delay comparison circuit, wherein the input of the first delay line and the input of the second delay line are arranged in parallel;
providing a first clock signal to the input of the first delay line;
providing a second clock signal to the input of the second delay line, wherein the second clock signal is time-independent of the first clock signal;
comparing a delay of the first delay line to the delay of a second delay line using the delay comparison circuit for each of a plurality of selected delay settings; and
determining if one or more of the delay comparisons exceeds a delay threshold using the delay comparison circuit to determine whether or not a manufacturing defect exists within one or more of the at least the first delay line and the second delay line in the IC.

16. The method of claim 15, wherein the IC comprises three or more delay lines, wherein the method further comprises selecting the first and second delay lines from the three or more delay lines using a selection circuit.

17. The method of claim 16, further comprising:
selecting a plurality of pairs of delay lines from the three or more delay lines using the selection circuit; and
for each of the plurality of pairs of delay lines, comparing a delay of a first delay line of the pair to a delay of a second delay line of the pair for each of the plurality of selected delay settings.

18. The method of claim 17, wherein the plurality of pairs of delay lines comprises all possible combinations of pairs of the three or more delay lines.

19. The method of claim 15, wherein the first and second delay lines comprise a digital delay control input configured to receive a digital delay control signal, and wherein the plurality of selected delay settings comprises different states of the digital delay control signal.

20. The method of claim 15, further comprising providing a first clock signal to an input of the first delay line and providing a second clock signal to an input of the second delay line, wherein the first and second clock signals have about the same frequency.

21. The method of claim 20, further comprising comparing the delay of the first delay line to the delay of the second delay line for at least one of a rising clock signal edge or a falling clock signal edge.

22. The method of claim 21, further comprising comparing the delay of the first delay line to the delay of the second delay line for both the rising and falling clock signal edges.

23. An apparatus comprising:
- three or more delay lines each having an input receiving a clock signal, wherein the clock signals are time-independent relative to each other, and wherein the inputs of the delay lines are arranged in parallel;
- a selection circuit configured to select a pair of delay lines from the three or more delay lines based on a state of a selection control signal;
- a delay comparison circuit configured to compare a delay of a first delay line of the selected pair of delay lines to a delay of a second delay line of the selected pair of delay lines and to generate a delay comparison indicative of whether or not a manufacturing defect is present within one of more of the three or more delay lines based on the result; and
- a control circuit configured to generate the selection control signal.

24. The apparatus of claim 23, wherein the control circuit is further configured to control the state of the selection control signal over time such that the delay comparison circuit generates at least one delay comparison for each of a plurality of selected pairs of the three or more delay lines.

25. The apparatus of claim 23, wherein the control circuit is further configured to generate a delay control signal operable to control a delay setting of the three or more delay lines.

26. The apparatus of claim 25, wherein the control circuit is further configured to control a state of the delay control signal over time such that the delay comparison circuit generates at least one delay comparison for each of a plurality of delay settings.

* * * * *